United States Patent
Lee

(10) Patent No.: US 9,306,128 B2
(45) Date of Patent: *Apr. 5, 2016

(54) LIGHT EMITTING APPARATUS AND SURFACE LIGHT SOURCE APPARATUS HAVING THE SAME

(71) Applicant: LG Innotek Co., Ltd., Seoul (KR)

(72) Inventor: Kwang Cheol Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/847,878

(22) Filed: Sep. 8, 2015

(65) Prior Publication Data

US 2015/0380611 A1     Dec. 31, 2015

Related U.S. Application Data

(63) Continuation of application No. 14/023,317, filed on Sep. 10, 2013, now Pat. No. 9,153,748, which is a continuation of application No. 12/144,442, filed on Jun. 23, 2008, now Pat. No. 8,556,488.

(30) Foreign Application Priority Data

Jun. 21, 2007   (KR) .................. 10-2007-0060930

(51) Int. Cl.
| | |
|---|---|
| F21V 7/04 | (2006.01) |
| H01L 33/48 | (2010.01) |
| H01L 33/62 | (2010.01) |
| H01L 25/075 | (2006.01) |
| H01L 33/54 | (2010.01) |
| H01L 33/50 | (2010.01) |
| H01L 33/58 | (2010.01) |
| F21V 8/00 | (2006.01) |

(52) U.S. Cl.
CPC ............ *H01L 33/486* (2013.01); *G02B 6/0031* (2013.01); *G02B 6/0068* (2013.01); *G02B 6/0073* (2013.01); *H01L 25/0753* (2013.01); *H01L 33/507* (2013.01); *H01L 33/54* (2013.01); *H01L 33/58* (2013.01); *H01L 33/62* (2013.01)

(58) Field of Classification Search
CPC ............... G02B 6/0068; G02B 6/0073; H01L 25/0753; H01L 33/483; H01L 33/50
USPC ........................ 362/249.02, 311.02, 608, 612, 362/621–622, 800; 257/98–100; 349/68–69
See application file for complete search history.

(56) References Cited

U.S. PATENT DOCUMENTS

| | | |
|---|---|---|
| 6,608,332 B2 | 8/2003 | Shimizu et al. |
| 7,455,423 B2 | 11/2008 | Takenaka |
| (Continued) | | |

FOREIGN PATENT DOCUMENTS

| | | |
|---|---|---|
| JP | 2004-71726 A | 3/2004 |
| KR | 10-2007-0014861 A | 2/2007 |
| KR | 10-2007-0045420 A | 5/2007 |

*Primary Examiner* — Jason Moon Han
(74) *Attorney, Agent, or Firm* — Birch, Stewart, Kolasch & Birch, LLP

(57) ABSTRACT

Provided are a light emitting apparatus and a surface light source apparatus having the same. The light emitting apparatus comprises a package body, a first color light emitting part in a first cavity of the package body, and a second color light emitting part in a second cavity of the package body. The package body comprises a plurality of cavities.

20 Claims, 6 Drawing Sheets

(56) References Cited

U.S. PATENT DOCUMENTS

| | | |
|---|---|---|
| 7,537,371 B2 | 5/2009 | Okada et al. |
| 7,582,906 B2 | 9/2009 | Kurihara |
| 2006/0245188 A1 | 11/2006 | Takenaka |
| 2007/0025098 A1 | 2/2007 | Kim et al. |
| 2007/0109792 A1 | 5/2007 | Chosa et al. |
| 2009/0309485 A1 | 12/2009 | Tamaki et al. |

…

LIGHT EMITTING APPARATUS AND SURFACE LIGHT SOURCE APPARATUS HAVING THE SAME

CROSS-REFERENCE TO RELATED APPLICATIONS

This application is a Continuation of co-pending application Ser. No. 14/023,317, filed Sep. 10, 2013, which is a Continuation of application Ser. No. 12/144,442, filed on Jun. 23, 2008, now U.S. Pat. No. 8,556,488, issued Oct. 15, 2013, which claims priority under 35 U.S.C. 119 of Korean Patent Application No. 10-2007-0060930, filed on Jun. 21, 2007, all of which are hereby expressly incorporated by reference in their entireties.

BACKGROUND

Nitride semiconductors in III-V groups are variously applied to a light device such as blue/green light emitting diodes (LEDs), a high speed switching device such as a metal oxide semiconductor field effect transistor (MOSFET) and a hetero junction field effect transistor (HEMT), and a light source of a lighting unit and a display device.

SUMMARY

Embodiments provide a light emitting apparatus that can realize a white light emitting part and a green light emitting part in one package, and a surface light source apparatus having the same.

Embodiments provide a light emitting apparatus that operates in cooperation with an external apparatus to illuminate white light and/or green light in the form of surface light, and a surface light source apparatus having the same.

An embodiment provides a light emitting apparatus comprising: a package body comprising a plurality of cavities; a first color light emitting part in a first cavity of the package body; and a second color light emitting part in a second cavity of the package body.

An embodiment provides a surface light source apparatus comprising: a light emitting unit comprising at least one light emitting apparatus comprising a first color light emitting part in a first cavity of a package body, and a second color light emitting part in a second cavity of the package body; and a surface light source unit one side of the light emitting unit, the surface light source unit illuminating light incident from the first color light emitting part and the second color light emitting part in a form of surface light.

An embodiment provides a surface light source apparatus comprising: a light emitting unit comprising at least one light emitting apparatus comprising a first color light emitting part in a first cavity of a package body, and a second color light emitting part in a second cavity of the package body, and a substrate to which the light emitting apparatus is electrically connected; a driving control circuit selectively controlling driving of the first color light emitting part and the second color light emitting part as a door is opened; and a surface light source unit one side of the light emitting apparatus, the surface light source unit illuminating light incident from the first color light emitting part and the second color light emitting part in a form of surface light.

DETAILED DESCRIPTION OF THE EMBODIMENTS

Reference will now be made in detail to the embodiments of the present disclosure, examples of which are illustrated in the accompanying drawings.

Figure 1:
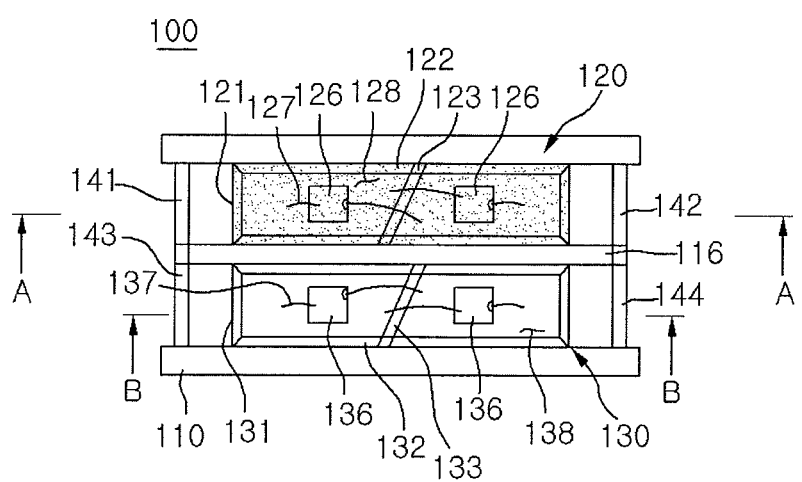
FIG. 1 is a front view of a light emitting apparatus according to a first embodiment.
Figure 2:
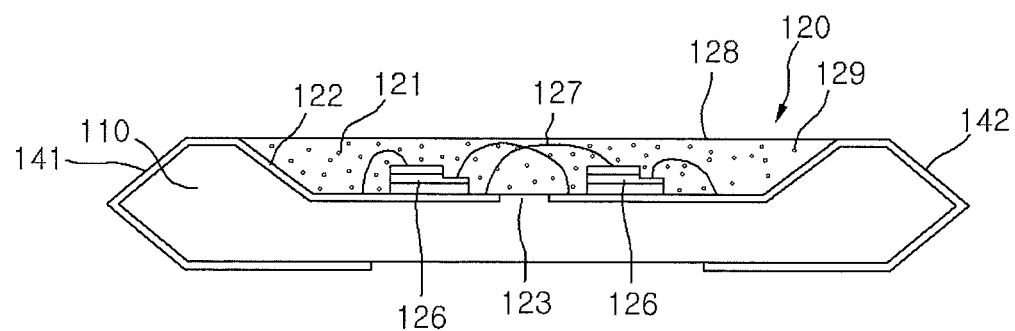
FIG. 2 is a cross-sectional view of FIG. 1 taken along a line A-A.
Figure 3:
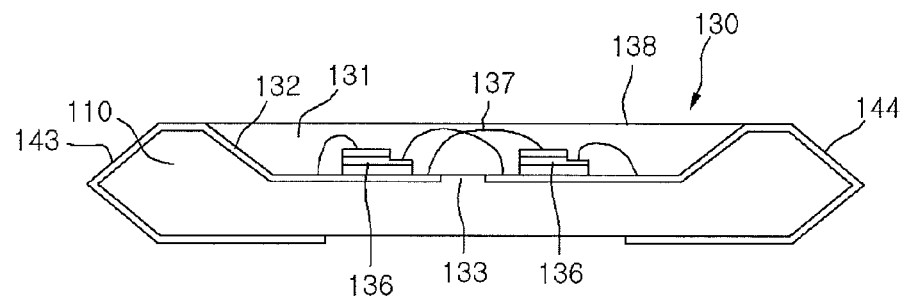
FIG. 3 is a cross-sectional view of FIG. 1 taken along a line B-B.

FIG. 1 is a front view of a light emitting apparatus according to a first embodiment, FIG. 2 is a cross-sectional view of FIG. 1 taken along a line A-A, and FIG. 3 is a cross-sectional view of FIG. 1 taken along a line B-B.

Referring to FIG. 1, the light emitting apparatus 100 comprises a package body 110, a first color light emitting part 120, and a second color light emitting part 130.

The package body 110 can be formed in a silicon-based wafer level package (WLP). Also, the package body 110 can be formed in one of a ceramic type substrate, a printed circuit board (PCB) type substrate, and a lead frame type substrate using materials such as a bismaleimide-triazine (BT)-resin and an FR-4. Also, the package body 110 can be formed in a single layer substrate or a multi-layered substrate. There is no limitation for a material of the package body 110.

The package body 110 comprises a first cavity 121 and a second cavity 131. The first color light emitting part 120 can be realized in the first cavity 121, and the second color light emitting part 130 can be realized in the second cavity 131. The first cavity 121 and the second cavity 131 can be arranged in a vertical direction or a horizontal direction in the upper surface of the package body 110. The locations of the first and second cavities 121 and 131 can change.

The first and second cavities 121 and 131 of the package body 110 are divided by a divider 116.

The first and second cavities 121 and 131 can be formed in a cup shape or a bathtub shape to have a predetermined depth on the upper surface of the package body 110. The surface shapes of the first and second cavities 121 and 131 can be a square or a rectangle, and are not limited thereto.

Lateral sides 122 and 132 of the first and second cavities 121 and 131 can be formed slope. The lateral sides 122 and 132 are inclined at a predetermined angle (for example, about 120°) with respect to the bottom of the cavities, respectively, to reflect incident light.

First to fourth electrodes 141, 142, 143, and 144 are formed on the surface of the package body 110. The first and second electrodes 141 and 142 extend from the bottom of the first cavity 121 up to the upper side, the lateral sides, and a portion of the rear side of the package body 110. The first and second electrodes 141 and 142 are electrically open by a first dielectric part 123 formed in the first cavity 121. The first to fourth electrodes 141, 142, 143, and 144 can be formed by a plating method. First dielectric part 123 may separate first and second electrodes 141 and 142 via an angle so as to have a first portion closer to the first electrode 141 than second electrode 142, and an opposite second portion closer to the second electrode 142 than first electrode 141.

The third and fourth electrodes 143 and 144 extend from the bottom of the second cavity 131 up to the upper side, the lateral sides, and the rear side of the package body 110. The third and fourth electrodes 143 and 144 are electrically separated by a second dielectric part 133 formed in the second cavity 131. Second dielectric part 133 may separate third and fourth electrodes 143 and 144 via an angle so as to have a first portion closer to the third electrode 143 than fourth electrode 144, and an opposite second portion closer to the fourth electrode 144 than third electrode 143.

Referring to FIGS. 1 and 2, the first color light emitting part 120 is realized in the first cavity 121, and comprises first light emitting diodes (LEDs) 126 and a first resin material 128, and emits first color light.

The first LEDs 126 comprises at least one blue LED. The first LED 126 is attached on the first electrode 141 or the second electrode 142 located at the first cavity 121, and is electrically connected to the first electrode 141 and the second electrode 142 using wires 127.

The first resin material 128 is formed in the first cavity 121, and can be formed of a resin material such as transparent epoxy and silicon, and comprises a phosphor 129 therein. The phosphor 129 absorbs a portion of blue light from the first LEDs 126 to emit yellow light, and can comprise YAG or silicate-based yellow phosphor, for example. The first color light emitting part 120 emits white light by mixing blue light from the first LEDs 126 with yellow light emitted from the phosphor 129.

For another example of the first color light emitting part 120, the first LEDs 126 can comprise a red LED, a green LED, and a blue LED. In this case, the first color light emitting part 120 can emit white light using these three color LEDs. In this case, phosphor do not need to be added to the first resin material 128.

For still another example of the first color light emitting part 120, the first LEDs 126 can comprise at least one ultraviolet (UV) LED, and the phosphor 129 added to the first resin material 128 can comprise red phosphor, green phosphor, and blue phosphor.

Referring to FIGS. 1 and 3, the second color light emitting part 130 is formed in the second cavity 131, and comprises second LEDs 136 and a second resin material 138, and emits second color light.

The second LEDs 136 are green LEDs. The second LED 136 is attached on the third electrode 143 or the fourth electrode 144 located on the bottom of the second cavity 131, and is electrically connected to the third electrode 143 and the fourth electrode 144 using wires 137.

The second resin material 138 is formed in the second cavity 131, protects the second LEDs 136, and can be formed of transparent epoxy or silicon.

For another example of the second color light emitting part 130, the second LEDs 136 are UV LEDs, and green phosphor can be added to the second resin material 138. Light emitted from the UV LEDs are changed into green light by the green phosphor.

Meanwhile, each of the first and second LEDs 126 and 136 is mounted in a chip shape. In case of a horizontal device, a plurality of wires can be connected to two electrodes. In case of a vertical device, each chip can be attached on one of the electrodes using a conductive adhesive, and connected to the other using a wire. Also, the first and second LEDs 126 and 136 can be connected to two electrodes in a flip-chip method.

The first and second LEDs 126 and 136 can change depending on a mounting method and the kind of the chip, and are not limited thereto.

Referring to FIGS. 2 and 3, the first and second color light emitting parts 120 and 130 can emit target color light through selective combination of LEDs of various colors, UV LEDs, and phosphor of various colors.

The surfaces of the first resin material 128 and the second resin material 138 can be at lease one of a concave shape, a convex shape, and a flat shape. A lens can be formed on the first resin material 128 and/or the second resin material 138.

In the case where a plurality of first LEDs 126 are provided, they can be connection in series or in parallel. Also, in the case where a plurality of second LEDs 136 are provided, they can be connection in series or in parallel.

An electrostatic discharge (ESD) device can be mounted in the package body 110. The ESD device is connected to the first LEDs 126 and the second LEDs 136 in parallel, and protects the first and second LEDs 126 and 136 from an overvoltage that may be applied thereto.

The first LEDs 126 of the first color light emitting part 120, and the second LEDs 136 of the second color light emitting part 130 can be driven independently. For example, the first LEDs 126 and the second LEDs 136 can operate in inverted states, respectively, or can be turned-on/off simultaneously.

Figure 4:
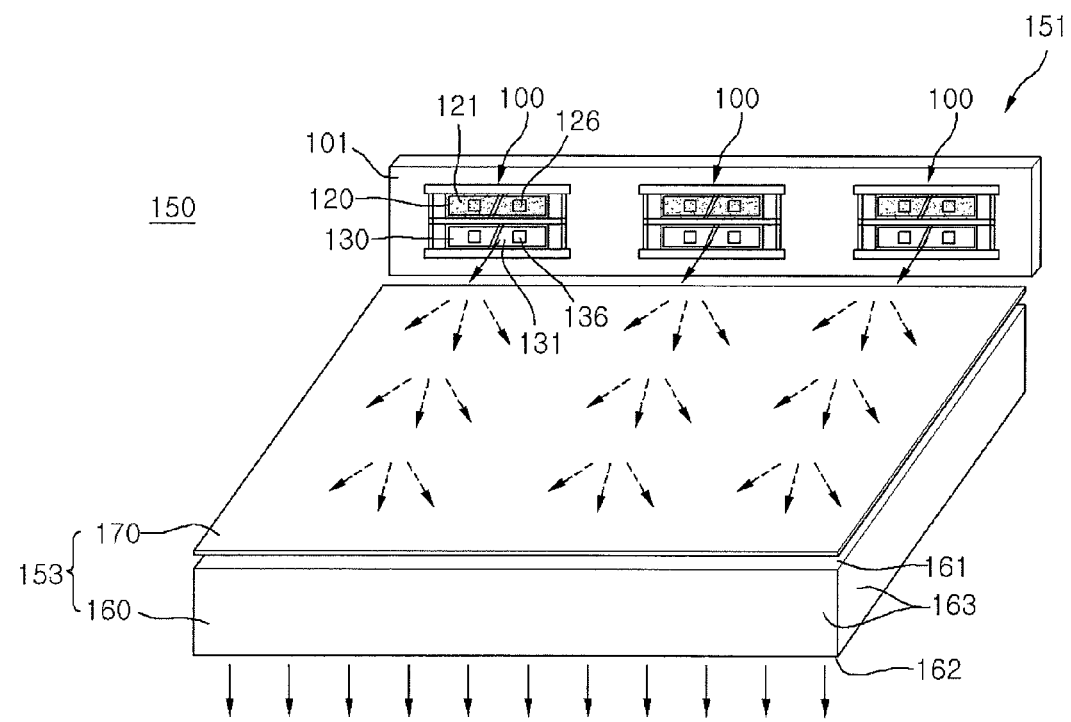
FIG. 4 is a perspective view of a surface light source apparatus having the light emitting apparatus of FIG. 1.
Figure 5:
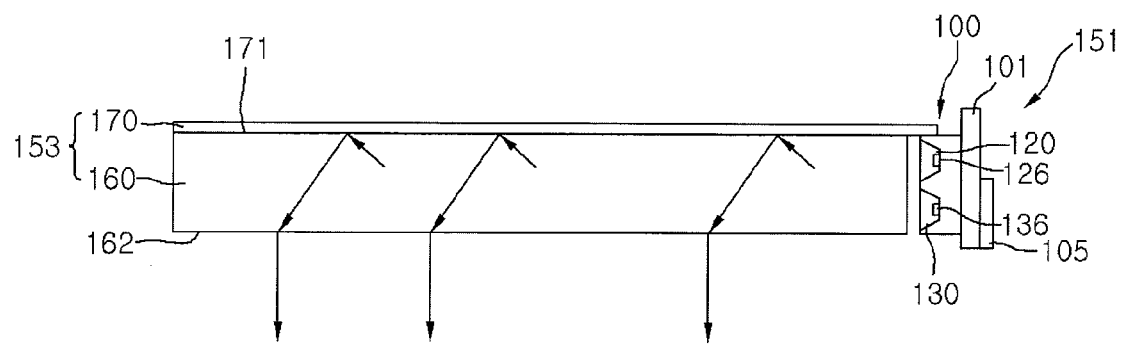
FIG. 5 is a side cross-sectional view of FIG. 4.

FIG. 4 is a perspective view of a surface light source apparatus having the light emitting apparatus of FIG. 1, and FIG. 5 is a side cross-sectional view of FIG. 4.

Referring to FIGS. 4 and 5, the surface light source apparatus 150 comprises a light emitting unit 151 and a surface light source unit 153.

The light emitting unit 151 comprises a substrate 101 and at least one light emitting apparatus 100. The substrate 101 can be realized in one of a metal substrate (for example, metal core PCB), a general PCB, and a flexible substrate. The substrate 101 can be another kind of substrate.

At least one light emitting apparatus 100 can be electrically connected on the substrate 101. In the case where a plurality of light emitting apparatuses 100 are provided, they can be arranged on the substrate 101 in a predetermined direction with a predetermined interval.

A water-proof member such as silicon or epoxy can be formed between the substrate 101 and the light emitting apparatus 100 in order to protect an electrical characteristic.

The first color light emitting part 120 of the light emitting apparatus 100 is disposed on an upper portion of the substrate 101, and the second color light emitting part 130 is disposed on a lower portion of the substrate 101. Here, the disposed positions of the first color light emitting part 120 and the second color light emitting part 130 can change.

The surface light source unit 153 is disposed on one side of the light emitting unit 151. The surface light source unit 153 is disposed in a light emission direction of the light emitting unit 151 to change incident point light into surface light and emit the same.

The surface light source unit 153 comprises a light guide plate (LGP) 160 and a reflector 170. The LGP 160 guides light incident from the first color light emitting part 120 and/or the second color light emitting part 130 to illuminate the light in the form of surface light.

The LGP 160 can be formed of an acryl-based resin, for example, polymethyl methacrylate (PMMA). Reflective patterns (not shown) can be formed on an upper surface 161 of the LGP 160. The reflective patterns are formed in a constant interval or a random interval to reflect incident light to a lower surface 162.

Also, the reflector 170 is attached on the upper surface of the LGP 160 to reflect back light that leaks to the upper surface 161 of the LGP 170. Also, the reflector 170 blocks light that leaks between the light emitting apparatus 100 and the LGP 160. That is, the length of the reflector 170 can be longer than that of the LGP 160.

A reflective material can be coated on surfaces 160 except the incident surface, the upper surface 161, and the lower surface 162 of the LGP 160 to prevent light leakage.

Referring to FIG. 5, the substrate 101 comprises a driving control circuit 105. The driving control circuit 105 selectively controls the first color light emitting part 120 and the second color light emitting part 130 to on/off modes.

When the first LEDs 126 of the first color light emitting part 120 are turned on, white light emitted from the first color light emitting part 120 is incident to the LGP 160 of the surface light source unit 153. The light incident to the LGP 160 is guided into the LGP 160, reflected by the reflector 170 and the reflective patterns (not shown), and illuminated in the form of surface light through the lower surface 162 of the LGP 162. At this point, the second color light emitting part 130 can operate in the off mode.

When the second LEDs 136 of the second color light emitting part 130 are turned on, green light emitted from the second color light emitting part 130 is incident to the LGP 160 of the surface light source unit 153. The light incident to the LGP 160 is guided into the LGP 160, reflected by the reflector 170 and the reflective patterns (not shown), and illuminated in the form of surface light through the lower surface 162 of the LGP 162.

The surface light source apparatus 150 can be applied to an apparatus requiring white light and green light, for example, to a cooling room and a freezing room of a refrigerator. In the case where the light emitting unit 151 is installed in a cooling room, the first color light emitting part 120 is turned on when a cooling room door is opened to illuminate white light to the inside of the cooling room, and is turned off when the cooling room door is closed. The second color light emitting part 130 is turned on when a refrigerator door is closed to illuminate green light to the inside of the cooling room, and is turned off when the refrigerator door is opened. The green light can maintain freshness of vegetables disposed inside the cooling room.

The light emitting unit 151 illuminates white light or green light as the refrigerator door is opened/closed to perform a lighting function and maintain freshness of vegetables disposed inside the cooling room. Embodiments can be applied to the field of a lighting as well as a general refrigerator and a kimchi refrigerator.

Figure 6:
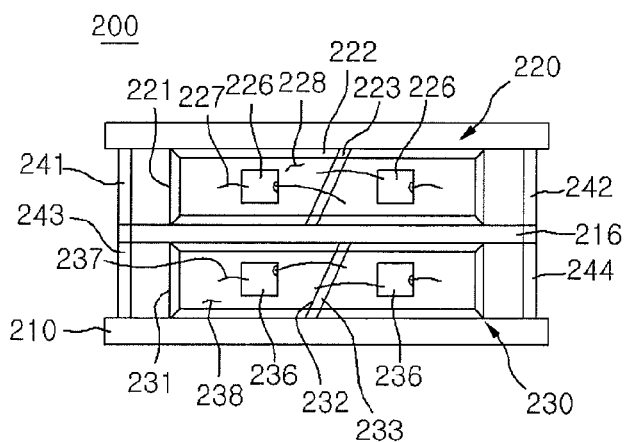
FIG. 6 is a front view of a light emitting apparatus according to a second embodiment.

FIG. 6 is a front view of a light emitting apparatus according to a second embodiment. In description of the second embodiment, explanations of the same parts as those of the first embodiment are omitted.

Referring to FIG. 6, a light emitting apparatus 200 comprises a package body 210, a first color light emitting part 220 emitting blue light, and a second color light emitting part 230 emitting green light.

The first color light emitting part 220 is realized in a first cavity 221 of the package body 210, and comprises first LEDs 226 and a first resin material 228. The first LEDs 226 are blue LEDs, and the first resin material 228 is formed of transparent epoxy or silicon.

The second color light emitting part 230 is realized in a second cavity 231 of the package body 210, and comprises second LEDs 236 and a second resin material 238. The second LEDs 236 are green LEDs, and the second resin material 238 is formed of transparent epoxy or silicon. Here, in the second color light emitting part 230, the second LED 236 can be UV LEDs and green phosphor can be added to the second resin material 238 to emit green light.

The first cavity 221 and the second cavity 231 of the package body 210 is divided by a divider 216.

The first color light emitting part 220 emits blue light, and the second color light emitting part 230 emits green light. Unlike the first embodiment, the second embodiment does not use phosphor, and the blue light can be changed into white light by phosphor disposed on an external light path.

Figure 7:
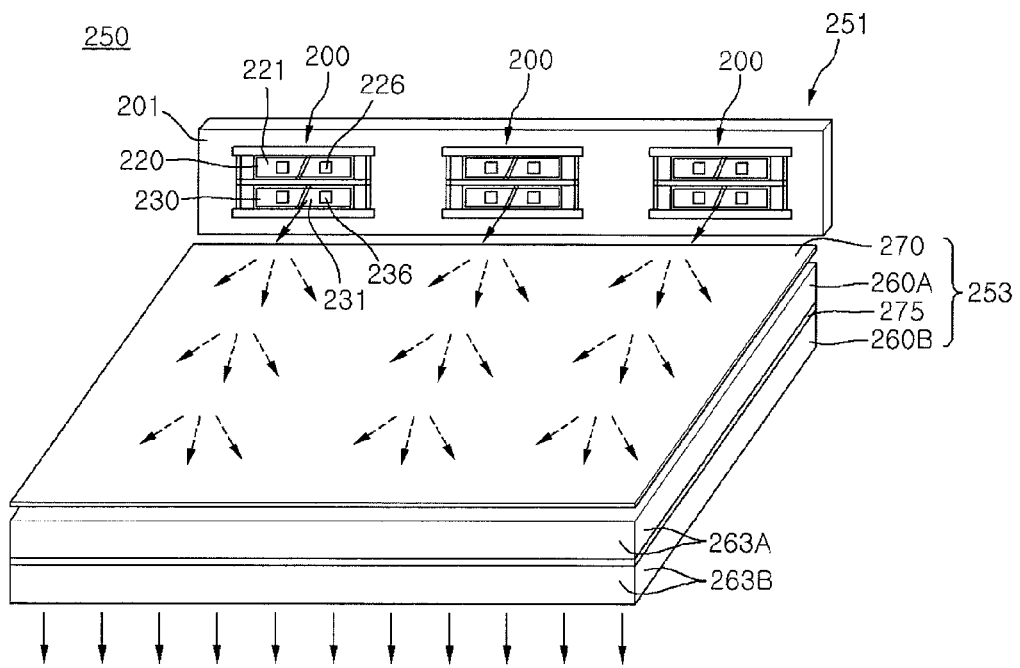
FIG. 7 is a perspective view of a surface light source apparatus having the light emitting apparatus of FIG. 6.
Figure 8:
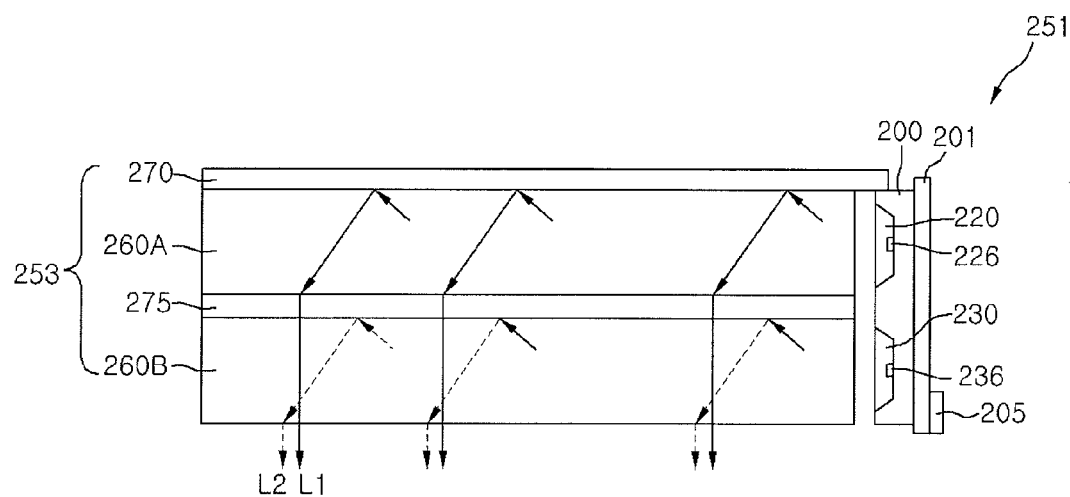
FIG. 8 is a side cross-sectional view of FIG. 7.

FIG. 7 is a perspective view of a surface light source apparatus having the light emitting apparatus of FIG. 6, and FIG. 8 is a side cross-sectional view of FIG. 7. In description of the surface light source apparatus, explanations of the same parts are omitted.

Referring to FIGS. 7 and 8, the surface light source apparatus 250 comprises a light emitting unit 251 and a surface light source unit 253.

The light emitting unit 251 comprises a light emitting apparatus 200 and a substrate 201. At least one light emitting apparatus 200 can be disposed on the substrate 201. In the case where a plurality of light emitting apparatuses 200 are disposed, they can be disposed in a predetermined direction.

A first color light emitting part 220 is disposed on the upper portion of the light emitting unit 251, and a second color light emitting part 230 is disposed on the lower portion of the light emitting unit 251. The first color light emitting part 220 emits blue light, and the second color light emitting part 230 emits green light.

A driving control circuit 205 can be disposed on a predetermined portion of the substrate 201 to control the first color light emitting part 220 and the second color light emitting part 230.

The surface light source unit 253 comprises a first LGP 260A, a second LGP 260B, a reflector 270, and a color filter film 275.

The first LGP 260A corresponds to the first color light emitting part 220, and the second LGP 260B corresponds to the second color light emitting part 230.

The first LGP 260A changes incident blue light into white light. For this purpose, yellow phosphor can be added to the first LGP 260A when the first LGP 260A is manufactured. Alternatively, at least one of the incident surface, the upper surface, and the lower surface, which is a light emission surface of the first LGP 260A, can be coated with yellow phosphor.

The reflector 270 is disposed on the first LGP 260A, and the color filter film 275 is dispose between the first LGP 260A and the second LGP 260B.

A reflective material can be coated on surfaces except the incident surface, the upper surface, and the lower surface of the first LGP 260A and the second LGP 260B to block light leaking to the outside.

The color filter film 275 is disposed between the first LGP 260A and the second LGP 260B. The color filter film 275 transmits all of light incident from the first LGP 260A, and reflects green light incident from the second LGP 260B.

Blue light emitted from the first color light emitting part 220 is incident to the first LGP 260A, and a portion of the blue light is guided to the inside of the first LGP 260A and changed into yellow light by phosphor coated inside the first LGP 260A. At this point, yellow light, blue light, and white light obtained by mixing the yellow light and the blue light can be emitted to the lower surface, which is a light emission surface of the first LGP 260A.

Also, light incident to the first LGP 260A is emitted to the lower direction in the form of surface light by reflective patterns (not shown) of the first LGP 260A and the reflector 270. At this point, the light emitted from the first LGP 260A passes through the color filter film 275 and is illuminated as white light by way of the second LGP 260B.

Green light emitted from the second color light emitting part 230 is incident to the second LGP 260B. The green light incident to the second LGP 260B is guided to the inside of the second LGP 260B, and reflected by reflective patterns of the second LGP 260B and the color filter film 275, and illuminated to the lower surface of the second LGP 260B in the form of surface light.

Referring to FIG. 8, a driving control circuit 205 can be disposed on a predetermined portion of the substrate 201.

The light emitting unit 251 emits at least one of blue light and green light. The blue light is emitted as white surface light L1 by the first LGP 260A, and the green light is emitted as green surface light L2 by the second LGP 260B. The color filter film 275 transmits light incident from the first LGP 260A, and reflects light incident to the second LGP 260B. This structure selectively transmits or reflects light using the color filter film 275 located between the first LGP 260a and the second LGP 260B, so that the light can be illuminated as white light or green light.

The disposed positions of the first color light emitting part 220, the first LGP 260A, the second color light emitting part 230, and the second LGP 260B can change.

Figure 9:
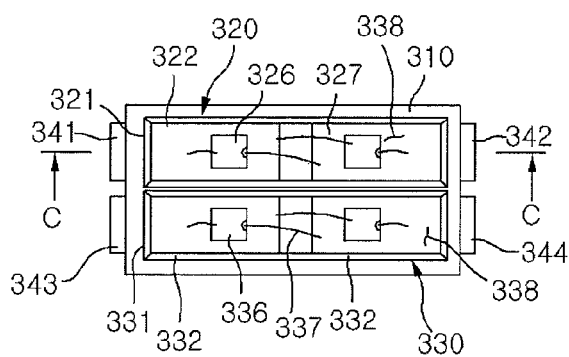
FIG. 9 is a front view of a light emitting apparatus according to a third embodiment.
Figure 10:
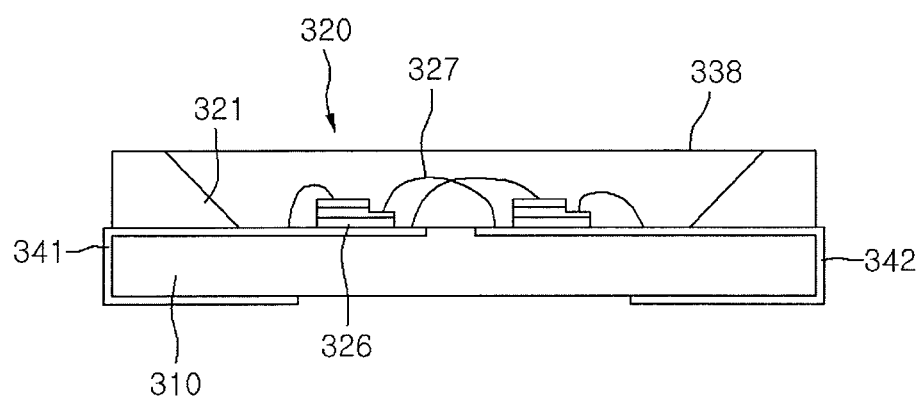
FIG. 10 is a cross-sectional view of FIG. 9, taken along a line C-C.

FIG. 9 is a front view of a light emitting apparatus according to a third embodiment, and FIG. 10 is a cross-sectional view of FIG. 9, taken along a line C-C.

Referring to FIGS. 9 and 10, the light emitting apparatus 300 comprises a package body 310, a first cavity 321, a second cavity 331, a plurality of lead frames 341, 342, 343, and 344, a first color light emitting part 320, and a second color light emitting part 330.

The package body 310 can be formed of one of poly phthal amid (PPA), liquid crystal polymer (LCP), and syndiotactic polystyrene (SPS).

A first lead frame 341 and a second lead frame 342 are formed in the first cavity 321 of the package body 310. The first lead frame 341 and the second lead frame 342 pass through the package body 310 at the bottom of the first cavity 321 and is exposed to the outside, and used as electrode terminals. Also, a third lead frame 343 and a fourth lead frame 344 are formed in the second cavity 331 of the package body 310. The third lead frame 343 and the fourth lead frame 344 pass through the package body 310 at the bottom of the second cavity 331 and is exposed to the outside, and used as electrode terminals.

The first color light emitting part 320 is formed in the first cavity 321, and comprises first LEDs 326 and a first resin material 338. The first LED 326 is attached on one of the first lead frame 341 or the second lead frame 342, and electrically connected to the first and second lead frames 341 and 342 using wires 327.

The second color light emitting part 330 is formed in the second cavity 331, and comprises second LEDs 336 and a second resin material 338. The second LED 336 is attached on one of the third lead frame 343 or the fourth lead frame 344, and electrically connected to the third and fourth lead frames 343 and 344 using wires 337.

The first and second LEDs 326 and 336 can be connected to the plurality of lead frames using a flip-chip method or at least one wire, and there is no limitation in connection the first and second LEDs 326 and 336.

Also, the first LEDs 326 of the first color light emitting part 320 can be formed in one group of a blue LED group, a UV LED group, a red/green/blue LED group. The first color light emitting part 320 can emit white light. The white light can be realized using a blue LED and a yellow LED, or using the UV LED and red/green/yellow phosphor, or the red/green/blue LEDs.

The second LEDs 336 of the second color light emitting part 330 comprise a green LED or a UV LED. The second color light emitting part 330 emits green light. The green light can be realized using a green LED, or using a UV LED and green phosphor.

A surface light apparatus can be realized by disposing the surface light source unit of the first embodiment or the surface light source unit of the second embodiment in the light emission direction of the light emitting apparatus 300. Accordingly, at least one of white light and green light can be provided in the form of surface light.

According to the embodiments, since one package emits white light and green light, the package can be installed in a place requiring white light and green light, for example, the inside of a refrigerator. Therefore, the white light is illuminated when a door of the refrigerator is opened, and green light is illuminated when the door of the refrigerator is closed to maintain freshness of vegetables in a cooling room.

Also, the white light and the green light can be provided in the form of surface light.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
a package body having a first cavity and a second cavity;
a first color light emitting part in the first cavity; and
a second color light emitting part in the second cavity,
wherein the first and second cavities include lateral sidewalls formed at oblique angles from respective bottom surfaces of the first and second cavities,
wherein the first color light emitting part includes:
a first body,
first and second light emitting diodes (LEDs), and
first and second electrodes electrically connected with the first and second LEDs, on the lateral sidewalls of the first cavity and sloped outer sidewalls of the first body, and along a partial portion of an under surface of the first body,
wherein the first and second electrodes are separated by a first gap, wherein the second color light emitting part includes
a second body,
third and fourth light emitting diodes (LEDs), and
third and fourth electrodes electrically connected with the third and fourth LEDs, on the lateral sidewalls of the second cavity and sloped outer sidewalls of the second body, and along a partial portion of an under surface of the second body,
wherein the third and fourth electrodes are separated by a second gap, and
wherein the first color light emitting part and the second color light emitting part emit different color light.

2. The light emitting apparatus according to claim 1, wherein the first color light emitting part comprises a first resin material in the first cavity, and the second color light emitting part comprises a second resin material in the second cavity.

3. The light emitting apparatus according to claim 1, wherein the first and second LEDs are blue LEDs, and
wherein the third and fourth LEDs are green LEDs.

4. The light emitting apparatus according to claim 1, further comprising a divider separating the first cavity from the second cavity.

5. The light emitting apparatus according to claim 1, wherein the first color light emitting part emits white light, and
wherein the second color light emitting part emits green light.

6. The light emitting apparatus according to claim 2, wherein the first light emitting diode comprises one of a blue light emitting diode or a ultraviolet light emitting diode, and the first resin material comprises at least one of a yellow phosphor material, a green phosphor material, or a blue phosphor material.

7. The light emitting apparatus according to claim 1, wherein the first and second electrodes are electrically insulated from each other in the first cavity, and
wherein the third and fourth electrodes are electrically insulated from each other in the second cavity.

8. The light emitting apparatus according to claim 1, further comprising a lens on the first cavity or the second cavity.

9. The light emitting apparatus according to claim 1, wherein the first and second light emitting diodes are mounted in a chip shape on the first and second electrodes, respectively.

10. The light emitting apparatus according to claim 1, wherein the first light emitting diode and the third light emitting diode are driven independently.

11. The light emitting apparatus according to claim 1, wherein the first light emitting diode and the third light emitting diode are operated in inverted states, respectively, or turned-on/off simultaneously.

12. The light emitting apparatus according to claim 1, wherein the first electrode has a first plate structure disposed on a first portion of the first body, the first plate structure including an upper surface having a first end portion between the first and second light emitting diodes, the first end portion tilted on a horizontal axis of the upper surface.
wherein the second electrode has a second plate structure disposed on a second portion of the first body, the second plate structure including an upper surface having a second end portion between the first and second light emitting diodes and parallel to the first end portion.

13. The light emitting apparatus according to claim 12, wherein the first gap is disposed between the first end portion and the second end portion.

14. The light emitting apparatus according to claim 13, wherein the first gap and the first end portion are parallel.

15. The light emitting apparatus according to claim 12, wherein an uppermost surface of the first plate structure and an uppermost surface of the second plate structure are disposed on the same horizontal plane.

16. A surface light source apparatus comprising:
the light emitting apparatus recited in claim 1; and
a surface light source unit on one side of the light emitting apparatus, the surface light source unit illuminating light incident from the light emitting apparatus in the form of surface light.

17. The surface light source apparatus according to claim 16, wherein the surface light source unit comprises:
a light guide plate receiving color light emitted from the light emitting apparatus to illuminate the color light in a form of surface light; and
a reflector reflecting light that leaks to the light guide plate.

18. The surface light source apparatus according to claim 16, wherein the first light emitting diode and the third light emitting diode are driven independently.

19. The surface light source apparatus according to claim 16, wherein the first light emitting diode and the third light emitting diode are operated in inverted states, respectively, or turned-on/off simultaneously.

20. The surface light source apparatus according to claim 16, wherein the first electrode has a first plate structure disposed on a first portion of the first body, the first plate structure including an upper surface having a first end portion between the first and second light emitting diodes, the first end portion tilted on a horizontal axis of the upper surface.
wherein the second electrode has a second plate structure disposed on a second portion of the first body, the second plate structure including an upper surface having a second end portion between the first and second light emitting diodes and parallel to the first end portion.

* * * * *